(12) United States Patent
Pan et al.

(10) Patent No.: US 12,051,677 B2
(45) Date of Patent: Jul. 30, 2024

(54) HIGH VOLTAGE LED CHIP SET, LED LIGHT SOURCE FOR PLANT LIGHT SUPPLEMENTATION AND ILLUMINATING DEVICE

(71) Applicant: HANGZHOU HANHUI OPTOELECTRONIC TECHNOLOGY CO., LTD., Hangzhou (CN)

(72) Inventors: Xiang Pan, Hangzhou (CN); Xuke Li, Hangzhou (CN)

(73) Assignee: HANGZHOU HANHUI OPTOELECTRONIC TECHNOLOGY CO., LTD., Hangzhou (CN)

( * ) Notice: Subject to any disclaimer, the term of this patent is extended or adjusted under 35 U.S.C. 154(b) by 506 days.

(21) Appl. No.: 17/436,663

(22) PCT Filed: Nov. 1, 2019

(86) PCT No.: PCT/CN2019/114979
§ 371 (c)(1),
(2) Date: Nov. 30, 2021

(87) PCT Pub. No.: WO2020/177359
PCT Pub. Date: Sep. 10, 2020

(65) Prior Publication Data
US 2022/0173079 A1    Jun. 2, 2022

(30) Foreign Application Priority Data

Mar. 7, 2019 (CN) .......................... 201910171900.5
Mar. 7, 2019 (CN) .......................... 201910171911.3

(Continued)

(51) Int. Cl.
*H01L 25/075* (2006.01)
*A01G 7/04* (2006.01)
(Continued)

(52) U.S. Cl.
CPC .......... *H01L 25/0753* (2013.01); *A01G 7/045* (2013.01); *H01L 33/504* (2013.01); *H01L 33/32* (2013.01); *H01L 33/56* (2013.01)

(58) Field of Classification Search
CPC ....... H01L 33/504; H01L 33/32; H01L 33/56; A01G 7/045
See application file for complete search history.

(56) References Cited

U.S. PATENT DOCUMENTS 6,921,182 B2 * 7/2005 Anderson, Jr. ........ A01G 7/045
                                                              362/800
10,149,439 B2 * 12/2018 Hanson .................... A01G 2/00
(Continued)

FOREIGN PATENT DOCUMENTS

CN        103220902 A      7/2013
CN        104241506 A     12/2014
(Continued)

*Primary Examiner* — Mark W Tornow
(74) *Attorney, Agent, or Firm* — Bayramoglu Law Offices LLC (57) ABSTRACT

A front-mounted high-voltage LED light source for supplementing light to plants includes a substrate, a high-voltage LED chip set, a first layer of glue powder and a second layer of glue powder. By controlling a weight ratio of the transparent adhesive medium and the red fluorescent particles in the first layer of glue powder, as well as thickness of the first layer of glue powder; and, by controlling a weight ratio of the transparent adhesive medium and the yellow fluorescent particles in the second layer of glue powder, as well as the thickness of the second layer of glue powder, a ratio range of photon number of red light, blue light to green light (Continued)

emitted by the front-mounted high-voltage LED light source for supplementing light to plants per a unit time is (65-95):(5-30):(5-25).

17 Claims, 1 Drawing Sheet

(30) Foreign Application Priority Data

Mar. 7, 2019 (CN) .......................... 201910171917.0
Mar. 7, 2019 (CN) .......................... 201910172491.0

(51) Int. Cl.
*H01L 33/32* (2010.01)
*H01L 33/50* (2010.01)
*H01L 33/56* (2010.01)

(56) References Cited

U.S. PATENT DOCUMENTS

| | | | |
|---|---|---|---|
| 10,306,841 B2* | 6/2019 | Fok | A01G 9/249 |
| 10,683,990 B2* | 6/2020 | Dutta | A01G 7/045 |
| 2016/0262313 A1* | 9/2016 | Szeto | A01G 7/045 |

FOREIGN PATENT DOCUMENTS

| | | |
|---|---|---|
| CN | 204348757 U | 5/2015 |
| CN | 104766916 A | 7/2015 |
| CN | 104768370 A | 7/2015 |
| CN | 104934457 A | 9/2015 |
| CN | 105202484 A | 12/2015 |
| CN | 106439626 A | 2/2017 |
| CN | 107706282 A | 2/2018 |
| CN | 107799510 A | 3/2018 |
| CN | 108022922 A | 5/2018 |
| CN | 207705238 U | 8/2018 |
| CN | 207781642 U | 8/2018 |
| CN | 108559491 A | 9/2018 |
| CN | 109058778 A | 12/2018 |
| CN | 109216529 A | 1/2019 |
| EP | 2988340 A1 | 2/2016 |
| JP | 2019016780 A | 1/2019 |
| KR | 20130104201 A | 9/2013 |

\* cited by examiner

HIGH VOLTAGE LED CHIP SET, LED LIGHT SOURCE FOR PLANT LIGHT SUPPLEMENTATION AND ILLUMINATING DEVICE

CROSS REFERENCE TO THE RELATED APPLICATIONS

This application is the national phase entry of international Application No. PCT/CN2019/114979, filed on Nov. 1, 2019, which is based upon and claims priority to Chinese Patent Application No. 201910171917.0, filed on Mar. 7, 2019, Chinese Patent Application No. 201910171900.5, filed on Mar. 7, 2019, Chinese Patent Application No. 201910172491.0, filed on Mar. 7, 2019, and Chinese Patent Application No. 201910171911.3, filed on Mar. 7, 2019, the entire contents of which are incorporated herein by reference.

TECHNICAL FIELD

The present disclosure relates to an LED light source for supplementing light to plants and a lamp using the light source, and belongs to the technical field of lighting in facility agriculture.

BACKGROUND

The LED lighting system for plants is a central technical equipment of facility agriculture, which provides photosynthetic energy and light signals for plant production. The plant physiological response mechanism to LED as a new light source has been widely revealed, and the biological basis of its application has been very clear. At present, for LED lamps for plant growth, the lamps for plant growth are usually manufactured by combining two kinds of LED light sources, red and blue light LED light sources or red and white LED light sources. Traditional low-voltage LED light sources and lamps have inherent disadvantages including short life of driving power supply, low conversion efficiency, poor heat dissipation of the low-voltage LED, and inability to work at high current. In the LED lighting equipment, light efficiency of chip, packaging method, and driving efficiency affect the luminous efficiency of the LED lighting equipment. For devices containing LED chips (and/or one or more other solid-state light-emitting devices), the driving technology with the best performance provides "high voltage and low current" rather than "low voltage and high current". An ordinary minitype LED chip operates at a current of 20 to 30 mA and a voltage of 3 V, but an ordinary power chip operates at 350 mA and 3 V.

Therefore, the low-voltage LED in the prior art has the following disadvantages.

First, the chromatogram ratio of the red and blue lights of the plant lamp is generally between 5:1 and 10:1, and usually optionally, between 7:1 and 8:1. Under the premise that the number of blue light LED is fewer, red LEDs are uniformly arranged, or even if the light emission angle of the blue light LED is adjusted to be the best, the light qualities of red and blue lights are not sufficiently mixed, so non-uniform distribution of light quality is prone to occur.

Second, an additional drive power supply with a larger power is needed, and the conversion efficiency of electric energy is low. Traditional GaN-based light-emitting diodes operate at a DC voltage with the voltage range of 2.9 to 3.5V, and the working current is usually 20 mA. In order to achieve the brightness of the light-emitting diodes required for ordinary lighting, the working current of the LED chip is generally increased to more than 100 mA. Currently, the commonly used working currents are 1.00 mA, 350 mA and 700 mA. Since the current municipal power system is based on AC high voltage, it is necessary to use electrical energy conversion means such as a step-down transformer or a rectifier to provide a stable current source to control the LED light. If a LED chip with large current and high power is used, a larger driving power supply is required in the driving device. Although the existing driving power technology is relatively mature, the driving power supply has no too high reliability (about 20,000 hours) and a service life generally lower than that of the LED light source (up to 50,000 to 100,000 hours) which becomes the main bottlenecks of the service life of the LED lighting equipment.

When the AC main power is converted to DC power, there will be a part of power loss, which will reduce the working efficiency of the LED. At the same time, these additional transformers or rectifiers will increase the overall cost of manufacture, take up space and affect the appearance of the lighting tools, and generate heat, thereby reducing the long-term use safety of LED. Moreover, the additional circuit itself has a service life shorter than that of the LED, reducing the overall service life of the LED in the application.

Third, for the high-power LED lamps that usually operate at high current, the current expansion problem seriously affects its performance, resulting in low light output rate and increased power consumption. The non-uniform current expansion easily leads to current crowding, which greatly reduces the luminous efficiency of the device. When the number of LED light strings remains constant, when the AC voltage input from the power input terminal of the LED driving system increases, and when the system current does not increase, the resistance of the power tube will increase, resulting in an increase in the power consumption of the power tube and serious heating. Once the temperature in the chip increases to trigger the over-temperature regulation, the total power of the system will increase firstly and then decrease, resulting in unstable power and serious fluctuations. The line loss caused by high-current driving is also relatively high, the junction temperature of the chip increases at high current injection, which further affects the luminous efficiency. As a result, the energy consumption increases, and the heat dissipation burden of the lamp also increases. It is necessary to design a complex structure for heat dissipation or arrange an additional radiator to reduce temperature, resulting in high costs and making it difficult for the price of LED lamps to drop.

In addition, the alternating current is the mains supply of AC 220V, has a phenomenon of voltage instability and great fluctuation of voltage, sometimes up to 280V. However, through current limit using resistances, the current will also fluctuate greatly, the LED cannot be protected by effectively constant current, and resistors will generate heat, consume power, and reduce light efficiency. Moreover, the packaging application of product increases the volume of the circuit product and the costs for assembly, wiring, and labor.

SUMMARY

Embodiments of the present disclosure seek to provide an LED light source for supplementing light to plants and a lamp using the light source, which emit light recipe with different spectral compositions at a fixed ratio in a single LED lighting equipment, thereby facilitating manufacturing, the cost control and the user's use.

To solve the technical problem of the present disclosure, the following technical solutions are adopted:

a front-mounted high-voltage LED light source for supplementing light to plants, comprising a substrate, a high-voltage LED chip set, a first layer of glue powder and a second layer of glue powder, wherein the high-voltage LED chip set includes a plurality of LED chips connected in series and/or in parallel; the LED chips are blue light LED chips and/or ultraviolet LED chips;

the upper part of the LED chip is covered with the first layer of glue powder; the first layer of glue powder fixes the LED chip on the substrate and is a mixture of a transparent adhesive medium and red fluorescent particles;

the second layer of glue powder covers the first layer of glue powder and completely coats the first layer of glue powder; the second layer of glue powder is a mixture of a transparent adhesive medium and the yellow fluorescent particles; and by controlling a weight ratio of the transparent adhesive medium and the red fluorescent particles in the first layer of glue powder as well as thickness of the first layer of glue powder; and by controlling a weight ratio of the transparent adhesive medium and yellow fluorescent particles in the second layer of glue powder as well as thickness of the second layer of glue powder, a ratio range of photon number of red light, blue light to green light emitted by the front-mounted high-voltage LED light source for supplementing light to plants per a unit time is 65-95:5-30:5-25; or a ratio range of photon number of red light, blue light, green light to ultraviolet light emitted by the front-mounted high-voltage LED light source for supplementing light to plants per a unit time is 70-95:5-30:5-20:1-5.

To solve the technical problem of the present disclosure, the following technical solutions are further adopted:

a front-mounted high-voltage LED light source for supplementing light to plants, comprising a substrate, a high-voltage LED chip set, a first layer of glue powder and a second layer of glue powder, wherein the high-voltage LED chip set includes a plurality of LED chips connected in series and/or in parallel; the LED chips are blue light LED chips and/or ultraviolet LED chips;

the upper part of the LED chip is covered with the first layer of glue powder; the first layer of glue powder fixes the LED chip on the substrate, and is a mixture of a transparent adhesive medium and red fluorescent particles;

the second layer of glue powder covers the first layer of glue powder and completely coats the first layer of glue powder; the second layer of glue powder is a mixture of a transparent adhesive medium and infrared fluorescent particles; and by controlling a weight ratio of the transparent adhesive medium and the red fluorescent particles in the first layer of glue powder, as well as thickness of the first layer of glue powder; and by controlling a weight ratio of the transparent adhesive medium and the infrared fluorescent particles in the second layer of glue powder, as well as thickness of the second layer of glue powder, a ratio range of photon number of red light, blue light to infrared light, emitted by the front-mounted high-voltage LED light source for supplementing light to plants per a unit time is 65-95:5-30:1-15, or a ratio range of photon number of red light, blue light, infrared light to ultraviolet light emitted by the front-mounted high-voltage LED light source for supplementing light to plants per a unit time is 70-95:5-30:1-15:1-10.

To solve the technical problem of the present disclosure, the following technical solutions are further adopted:

a front-mounted high-voltage LED chip set, comprising a plurality of LED chips, wherein the LED chip is a front-mounted LED chip; the front-mounted LED chip includes a substrate layer, and an N—GaN layer, a light-emitting layer, a P—GaN layer and a transparent conductive layer stacked sequentially on the substrate layer; the LED chip is also arranged with a P electrode and an N electrode, and the P electrode is arranged on the transparent conductive layer, and the N electrode is arranged on the N—GaN layer;

the LED chips are connected in series, and the P electrode of the LED chip is connected to the N electrode of other LED chip;

or, the LED chips are connected in series and then in parallel, and include at least two parallel-connected LED chip sets, and the P electrodes and the N electrodes of the LED chips in the LED chip sets are connected in series with each other through connecting electrodes;

or, the LED chips are connected in parallel and then in series, and include at least two series-connected LED chip sets, and the P electrodes and the N electrodes of the LED chips in the LED chip sets are connected in parallel to each other through connecting electrodes.

To solve the technical problem of the present disclosure, the following technical solutions are further adopted:

an LED light source for supplementing light to plants, comprising a substrate, a high-voltage LED chip set and a layer of glue powder; wherein the high-voltage LED chip set adopts the front-mounted high-voltage LED chip set according to claim 8; and the LED chip is a blue light LED chip and/or an ultraviolet LED chip;

the upper part of the LED chip is covered with a layer of glue powder; the layer of glue powder fixes the LED chip on the substrate, and is a mixture of a transparent adhesive medium and red fluorescent particles; and by controlling a weight ratio of the transparent adhesive medium to the red fluorescent particles in the layer of glue powder, as well as thickness of the layer of glue powder, a ratio range of the photon number of red light to blue light emitted by the LED light source for supplementing light to plants per a unit time is 65-95: 5-35; or a ratio range of photon number of red light, blue light to ultraviolet light emitted by the LED light source for supplementing light to plants per a unit time is 70-95:5-30:1-5.

To solve the technical problem of the present disclosure, the following technical solutions are further adopted:

a flip-type high-voltage LED chip set, comprising a plurality of LED chips, wherein the LED chips are flip-type LED chips; the flip-type LED chips include a substrate layer, and an N—GaN layer, a light-emitting layer, a P—GaN layer and a transparent conductive layer stacked sequentially under the substrate layer; the LED chip is also arranged with a P electrode bonding pad and an N electrode bonding pad, and the P electrode bonding pad and the N electrode bonding pad are on the same side of the chip, the P electrode bonding pad is arranged on the transparent conductive layer, the N electrode bonding pad is arranged on the N—GaN layer, and the P electrode bonding pad and the N electrode bonding pad are electrically isolated from each other; and each of the LED chips is flip-type welded on the substrate, and interconnected through a printed circuit on the substrate; and the LED chips are connected in series, and the P electrode bonding pad of the LED chip is connected to the N electrode bonding pad of other LED chip;

or, the LED chips are connected in series and then in parallel includes at least two parallel-connected LED chip sets, and the P electrode bonding pads and the N electrode bonding pads of the LED chips inside the LED chip sets are connected in series with each other through connecting electrodes;

or, the LED chips are connected in parallel and then in series and includes at least two series-connected LED chip sets, and the P electrode bonding pads and the N electrode bonding pads of the LED chips inside the LED chip sets are connected in parallel to each other through connecting electrodes.

To solve the technical problem of the present disclosure, the following technical solutions are further adopted:

an LED light source for supplementing light to plants, comprising a substrate, a high-voltage LED chip set, a first layer of glue powder and a second layer of glue powder; wherein the high-voltage LED chip set is the flip-type high-voltage LED chip set according to claim 13; the LED chip is a blue light LED chip and/or an ultraviolet LED chip;

an insulating layer is formed on the substrate, a printed circuit is formed on the insulating layer, and a P electrode bonding pad and a N electrode bonding pad of the high-voltage LED chip are welded on the printed circuit by eutectic welding, bonding or conductive adhesion;

the upper part of the LED chip is covered with the first layer of glue powder; the first layer of glue powder fixes the LED chip on the substrate, and is a mixture of a transparent adhesive medium and red fluorescent particles;

the second layer of glue powder covers the first layer of glue powder and completely coats the first layer of glue powder; the second layer of glue powder is a mixture of a transparent adhesive medium and yellow fluorescent particles; and by controlling a weight ratio of the transparent adhesive medium and the red fluorescent particles in the first layer of glue powder as well as thickness of the first layer of glue powder; and by controlling a weight ratio of the transparent adhesive medium and the yellow fluorescent particles in the second layer of glue powder as well as thickness of the second layer of glue powder, a ratio range of photon number of red light, blue light to green light emitted by the high-voltage LED light source for supplementing light to plants per a unit time is 65-95:5-30:5-25; or a ratio range of photon number of red light, blue light, green light to ultraviolet light emitted by the front-mounted high-voltage LED light source for supplementing light to plants per a unit time is 70-95:5-30:5-25:1-5.

To solve the technical problem of the present disclosure, the following technical solutions are further adopted:

an LED light source for supplementing light to plants, comprising a substrate, a high-voltage LED chip set, a first layer of glue powder and a second layer of glue powder; wherein the high-voltage LED chip set is the flip-type high-voltage LED chip set according to claim 13; the LED chip is a blue light LED chip and/or an ultraviolet LED chip;

an insulating layer is formed on the substrate, a printed circuit is formed on the insulating layer, and the P electrode bonding pad and the N electrode bonding pad of the high-voltage LED chip are welded on the printed circuit by eutectic welding, bonding or conductive adhesion;

the upper part of the LED chip is covered with the first layer of glue powder; the first layer of glue powder fixes the LED chip on the substrate, and is a mixture of a transparent adhesive medium and red fluorescent particles;

the second layer of glue powder covers the first layer of glue powder and completely coats the first layer of glue powder; the second layer of glue powder is a mixture of a transparent adhesive medium and infrared fluorescent particles; and by controlling a weight ratio of the transparent adhesive medium and the red fluorescent particles in the first layer of glue powder, as well as thickness of the first layer of glue powder; and by controlling a weight ratio of the transparent adhesive medium and the infrared fluorescent particles in the second layer of glue powder, as well as thickness of the second layer of glue powder, a ratio range of photon number of red light, blue light to infrared light emitted by the flip-type high-voltage LED light source for supplementing light to plants per a unit time is 65 to 95:5 to 30:1 to 15; or a ratio range of photon number of red light, blue light, infrared light to ultraviolet light emitted by the flip-type high-voltage LED light source for supplementing light to plants per a unit time is 70-95:5-30:1-15:1-10.

To solve the technical problem of the present disclosure, the following technical solutions are further adopted:

a flip-type high-voltage LED light source for supplementing light to plants comprising a substrate, a high-voltage LED chip set and a layer of glue powder; wherein, the high-voltage LED chip set includes a plurality of LED chips connected in series and/or in parallel; the LED chips are blue light LED chips and/or ultraviolet LED chips; and an insulating layer is formed on the substrate, a connecting circuit is formed on the insulating layer, and the P electrode bonding pad and the N electrode bonding pad of the high-voltage LED chip are welded on the connecting circuit by eutectic welding, bonding or conductive adhesion;

the upper part of the LED chip is covered with a layer of glue powder; the layer of glue powder fixes the LED chip on the substrate, and is a mixture of a transparent adhesive medium and red fluorescent particles; and by controlling a weight ratio of the transparent adhesive medium and the red fluorescent particles in the layer of glue powder, as well as thickness of the layer of glue powder, a ratio range of photon number of red light to blue light emitted by the flip-type high-voltage LED light source for supplementing light to plants per a unit time is 65-95:5-35; or a ratio range of photon number of red light, blue light to ultraviolet light emitted by the flip-type high-voltage LED light source for supplementing light to plants per a unit time is 70-95:5-30:1-5.

To solve the technical problem of the present disclosure, the following technical solutions are further adopted:

a lighting equipment comprising an LED light source for supplementing light to plants.

The present disclosure has the following beneficial effects: the power generation bricks provided by the present disclosure can be laid on pedestrian streets, squares, roads, and floor roofs or used as walls of buildings in a city; and the collected solar energy is converted into electrical energy for surrounding electrical facilities, thereby reducing clutter of external wirings and reducing costs at the same time. The front-mounted high-voltage LED light source for supplementing light to plants of the present disclosure excites the red phosphor powder or mixed phosphor powder with red as a main body through a high-voltage DC chip, which can realize a small area of light source and a more uniform distribution of light quality. The light source itself has a high working voltage and is easy to achieve the working voltage of the finished product after packaging close to the mains power, thereby improving the conversion efficiency of the drive power. Due to the low working current, the line loss in the finished product application will also be significantly lower than that of the traditional DC LED chip; the working current is small, the heat generated is less, and the thermal resistance is reduced, the stability of light efficiency and the service life of the LED light source is improved. In addition, the high-voltage LED light source for supplementing light to plants reduces the number of die bond and bonding of the chip, which is beneficial to reduce the cost of packaging.

BRIEF DESCRIPTION OF THE DRAWINGS

References in the figure are as follows: 1—substrate; 2—LED chip; 3—first layer of glue powder; 4—second layer of glue powder; 5—insulating layer; 6—printed circuit; 7—connecting circuit.

DETAILED DESCRIPTION OF THE EMBODIMENTS

The technical solution of the present disclosure will be further described below in combination with Examples and the drawings.

Example 1

Figure 1:
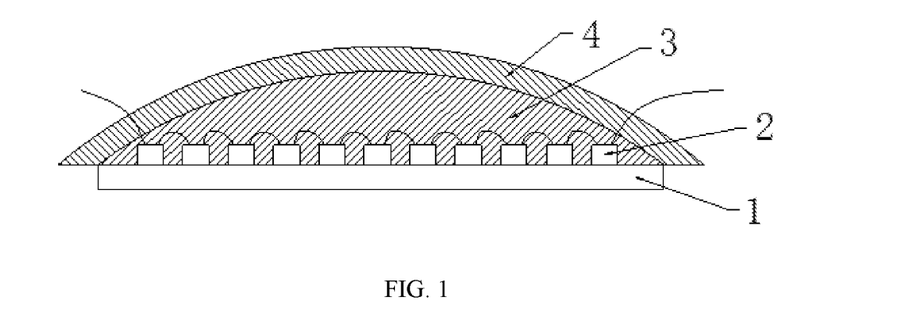
FIG. 1 is a schematic diagram of the structure of the LED light sources for supplementing light to plants according to Examples 1-3 of the present disclosure.

This Example provides a front-mounted high-voltage LED light source for supplementing light to plants including a substrate, a high-voltage LED chip set, a first layer of glue powder, and a second layer of glue powder.

The high-voltage LED chip set includes a plurality of LED chips connected in series and/or in parallel. In this Example, the LED chip is any one selected from the group consisted of: semiconductor light-emitting diodes; organic light-emitting diodes, OLED; quantum dot light emitting diode, QLED; and micro light emitting diode, Micro-LED. More preferably, the LED chip is a blue light LED chip and/or an ultraviolet LED chip, and the blue light LED chip is an LED chip with a light-emitting peak in a range of 400 inn to 480 nm or a combination of blue light LED chips with different wavelengths, and the ultraviolet LED chip is an LED chip with a light-emitting peak in a wavelength range of 320 nm to 400 nm or a combination of ultraviolet LED chips with different wavelengths. Herein, the "high voltage" in the present disclosure means that the voltage drop through the LED light source is at least three times more than that of voltage drop of one LED light-emitting device in the LED light source.

the upper part of the LED chip is covered with the first layer of glue powder. In this Example, the first layer of glue powder fixes the LED chip on the substrate, and it is a mixture of a transparent adhesive medium and red fluorescent particles, wherein, the weight ratio of the transparent adhesive medium and the red fluorescent particles ranges from 100:10 to 100:150, and as a preferred solution, 100:50 or 100:100 can be selected.

The second layer of glue powder covers the first layer of glue powder and completely coats the first layer of glue powder. In this Example, the second layer of glue powder is a transparent adhesive medium and yellow fluorescent particles. The weight ratio of the transparent adhesive medium and the yellow fluorescent particles ranges from 100:40 to 100:60, and preferably, the weight ratio of the transparent adhesive medium and the yellow fluorescent particles is 100:50.

The second layer of glue powder may also be doped with some green fluorescent particles, so that the blue light generated by the blue light LED chip and the ultraviolet light generated by the ultraviolet LED chip generate green light when the green fluorescent particles are excited. As a preferred solution, the mass ratio of the green fluorescent particles to the yellow fluorescent particles can be set to 1:1.

The blue light and the ultraviolet light emitted by the blue light LED chip and the ultraviolet LED chip pass through the fluorescent particles in the first layer of glue powder and the second layer of glue powder to form a spectrum matching photosynthesis curve after wavelength conversion, and is suitable for lighting requirements for different growth stages of plant.

The light emitted by the blue light LED chip is a blue light with a main wavelength range of 400 nm to 480 nm, and the red fluorescent particles and yellow fluorescent particles in the first layer of glue powder and the second layer of glue powder are respectively excited by the blue light to generate red light with the main wavelength range from 600 nm to 680 nm and green light with a main wavelength range from 490 nm to 590 nm, and unexcited blue light and the excited and converted light form a spectrum which matches spectrum characteristics of plant photosynthesis.

The light emitted by the ultraviolet LED chip is ultraviolet light with a main wavelength range of 320 nm to 400 nm, and the red fluorescent particles and yellow fluorescent particles in the first layer of glue powder and the second layer of glue powder are respectively excited by the ultraviolet light to generate red light with the main wavelength range from 600 nm to 680 nm and green light with main wavelength range from 490 nm to 590 nm, and the unexcited ultraviolet light and the excited and converted light form a spectrum which conforms to the characteristics of plant photosynthesis curve.

In this Example, by controlling a weight ratio of the transparent adhesive medium and the red fluorescent particles in the first layer of glue powder, as well as thickness of the first layer of glue powder; and by controlling a weight ratio of the transparent adhesive medium and the yellow fluorescence particles in the second layer of glue powder, as well as thickness of the second layer of glue powder, a ratio range of photon number of red light, blue light to green light (composite light of red light and yellow light) emitted by the high-voltage LED light source for supplementing light to plants per a unit time is 65-95:5-30:5-25; or a ratio range of red light, blue light, green light (combined light of red light and yellow light) to ultraviolet light emitted by the high-voltage LED light source for supplementing light to plants per a unit time is 70-95:5-30:5-20:1-5.

Preferably, the red fluorescent particles are at least one of $Mn^{4+}$-activated fluoro germinate phosphors; phosphors having at least one element selected from alkaline earth metal elements and at least one element selected from alkali metal elements in composition and containing such as aluminium oxidete, silicate and phosphate activated by $Eu^{2+}$; phosphors having Al and at least one element selected from Sr and Ca in composition and containing silicon nitride activated by $Eu^{2+}$, such as $CaAlSiN_3$: Eu-based phosphors; phosphors containing sulfide of Ca or Sr activated by $Eu^{2+}$; and phosphors having at least one element or ion selected from alkali metal elements and ammonium ions, $NH_4^+$ and at least one element selected from elements in Group 4 or Group 14 in composition and containing fluoride activated by $Mn^{4+}$, such as $K_2SiF_6$; or a combination thereof.

Preferably, the red fluorescent particles, such as $Eu^{2+}$-active nitride red fluorescent particles and $Mn^{4+}$-doped $K_2SiF_6$ red fluorescent particles, can cause the light source to emit red light with a main wavelength of 550 nm±20 nm and have a mass ratio of 4:1.

Preferably, the thickness of the first layer of glue powder can be set to 0.6 mm-1.0 mm, and the thickness of the second layer of glue powder can be set to 1 cm-1.5 cm, so that the ratio of the photon flux density is within the above range.

In addition, the first layer of glue powder and/or the second layer of glue powder are also doped with blue fluorescent particles, so that the ultraviolet LED chip can excite blue fluorescent particles to generate blue light with a main wavelength range of 400 nm to 480 nm. When the ultraviolet LED chip accounts for a large proportion of the total LED chips, by the blue light generated by the blue fluorescent particles, the photon number of ultraviolet light is decreased and the photon number of blue light is increased.

Preferably, the content of the blue fluorescent particles in the first layer of glue powder and the second layer of glue powder may be 10%-30% of the total weight of the first layer of glue powder and the second layer of glue powder.

In this Example, the LED chip is a front-mounted LED chip, and the LED chip includes a substrate layer, and an N—GaN layer, a light-emitting layer, a P—GaN layer, and a transparent conductive layer stacked sequentially on the substrate layer. The LED chip is further arranged with a P electrode and an N electrode, the P electrode is arranged on the transparent conductive layer, and the N electrode is arranged on the N—GaN layer.

The working voltage of the front-mounted LED chip is 9-220V and a plurality of front-mounted. LED chips are connected in series and/or in parallel, driven by an external DC or AC voltage, and the driving voltage is equal to or close to the working voltage of the external AC or DC.

Specifically, the LED chips are connected in series, and the P electrode of the LED chip is connected to the N electrode of other LED chip;

or, the LED chips are connected in series and then in parallel, and include at least two parallel-connected LED chip sets, and the P electrodes and the N electrodes of the LED chips in the LED chip sets are connected in series with each other through the connecting electrodes;

or, the LED chips are connected in parallel and then in series and includes at least two series-connected LED chip sets, and the P electrodes and the N electrodes of the LED chips in the LED chip sets are connected in parallel to each other through the connecting electrodes.

In this Example, considering that some fluorescent particles need to work in a low-temperature environment, a thermal insulation coating may be arranged between the first layer of glue powder and the LED chip. Moreover, a layer with better heat dissipation performance such as transparent resin and silica gel can be set in between the first layer of glue powder and the second layer of glue powder.

As another implementation, m this Example, it can be achieved by covering a single layer of glue powder on the high-voltage LED chip set. At this time, High-voltage LED chip set can be covered with the mixture of transparent adhesive medium, red phosphor powder and yellow phosphor powder, so that the ratio range of photon number of the red light, blue light to green light emitted by the high-voltage LED light source for supplementing light to plants per a unit time is 65-95:5-30:5-25; or the ratio range of photon number of red light, blue light to ultraviolet light emitted by the high-voltage LED light source for supplementing light to plants per a unit time is 70-95:5-30:1-5.

The front-mounted high-voltage LED light source for supplementing light to plants of the present disclosure excites the red phosphor powder or mixed phosphor powder with red as a main body through a high-voltage DC chip, which can realize a small area of light source and a more uniform distribution of light quality. The light source itself has a high working voltage and is easy to achieve the working voltage of the finished product after packaging close to the mains power, thereby improving the conversion efficiency of the drive power. Due to the low working current, the line loss in the finished product application will also be significantly lower than that of the traditional DC LED chip; the working current is small, the heat generated is less, and the thermal resistance is reduced, the stability of light efficiency and the service life of the LED light source is improved. In addition, the high-voltage LED light source for supplementing light to plants reduces the number of die bond and bonding of the chip, which is beneficial to reduce the cost of packaging.

The front-mounted high-voltage LED light source for supplementing light to plants can obtain lower thermal resistance than the high-voltage diodes which are generally realized by connecting multiple light-emitting diodes in series, and a smaller heat dissipation module can be used in the manufacture of lamps.

The high-voltage LED chip set adopts low-current drive, which improves the reliability of high-voltage LED devices and reduces the line loss in the application process. At the same time, it can also greatly reduce the design requirements of the heat dissipation shell and the heat dissipation system, and reduce the packaging cost.

In this Example, the high-voltage LED chip set may include only one high-voltage LED chip, and the high-voltage LED chip includes a plurality of LED sub-chips connected in series and/or in parallel. In this Example, the LED sub-chip includes any one selected from the group of: semiconductor light-emitting diodes; organic light-emitting diodes OLED and quantum dot light-emitting diodes QLED. More preferably, the blue light LED sub-chips is an LED sub-chips with a combination of LED sub-chips with at least two light-emitting peaks or a single emission peak in the range of 400 nm to 480 nm, and the ultraviolet LED sub-chip is a combination of LED sub-chips with at least two light-emitting peaks or an LED sub-chip with a single light-emitting peak in the wavelength range of 320 nm to 400 nm. Herein, the "high voltage" in the present disclosure means that the voltage drop through the LED light source is at least three times the voltage drop of one LED light-emitting device in the LED light source.

The high-voltage LED chip is a front-mounted high-voltage LED chip, and the LED sub-chip of the front-mounted high-voltage LED chip includes a substrate layer, an N—GaN layer, a light-emitting layer, and a P—GaN layer stacked sequentially on the substrate layer. An isolation trench is arranged between the LED sub-chips, and the isolation trench extends to the substrate layer, and an insulating dielectric layer is arranged in the isolation trench. The substrate layer of each LED sub-chip forms a whole.

The LED sub-chip is also arranged with a P electrode, an N electrode and an electrical interconnection structure, the P electrode is arranged on the transparent conductive layer, the N electrode is arranged on the N—GaN layer, and the electrical interconnection structure connects the P electrode of one sub-chip to the N electrode of the other sub-chip.

The working voltage of the front-mounted LED sub-chips is 9-220V, and a plurality of front-mounted LED sub-chips are connected in series and/or in parallel, and driven by an external DC or AC voltage, and the driving voltage is equal to or close to the working voltage of the external AC or DC.

Specifically, the LED sub-chips are connected in series, and the P electrode of the LED sub-chip is connected to the N electrode of other LED sub-chip;

or, the LED sub-chips are connected in series and then in parallel includes at least two parallel LED chips, and the P electrodes and the N electrodes of the LED sub-chips inside the LED chips are connected in series with each other through the connecting electrodes;

or, the LED sub-chips are connected in parallel and then in series and includes at least two series-connected LED chips, and the P-electrodes and N-electrodes of the LED sub-chips inside Me LED chips are connected in parallel with each other through the connecting electrodes.

The front-mounted high-voltage LED light source for supplementing light to plants has two advantages. First, it has the effectively decreased driving cost and weight of the LED lighting lamp. Second, it works at high voltage and low current, and has decreased heat generation, thereby reducing the requirements for the heat dissipation system, and can save heat dissipation materials due to the structure of the lamp.

At the same time, the front-mounted high-voltage LED light source for supplementing light to plants can work only with a high-voltage linear constant current source. The high-voltage linear constant current power supply has no transformer and no electrolytic capacitor, which solves the problem of service life of ordinary LED driving power and electrolytic capacitor.

The use of front-mounted high-voltage LED light source for supplementing light to plants can greatly simplify the driving power supply and greatly reduce the overall power consumption, thereby greatly reducing the design requirements of the heat dissipation housing, which also means the cost of lighting lamps is effectively reduced.

Example 2

This Example provides a front-mounted high-voltage LED light source for supplementing light to plants. The difference from Example 1 is in that infrared fluorescent particles are used to replace yellow fluorescent particles. At this time, the weight ratio of the transparent adhesive medium and the infrared fluorescent particles ranges from 100:40 to 100:60, and preferably, the weight ratio of the transparent adhesive medium and the infrared fluorescent particles is 100:50.

In this Example, by controlling the weight ratio of the transparent adhesive medium and the red fluorescent particles in the first layer of glue powder, as well as thickness of the first layer of glue powder; and by controlling the transparent adhesive medium and infrared fluorescence particles in the second layer of glue powder, as well as thickness of the second layer of glue powder, the ratio range of photon number of red light, blue light to green light emitted by the high-voltage LED light source for supplementing light to plants per a unit time is 65-95:5-30: 5-25; or the ratio range of photon number of red light, blue light, green light to ultraviolet light emitted by the high-voltage LED light source for supplementing light to plants per a unit time is 70-95:5-30:5-20:1-5.

The second layer of glue powder may also be doped with some green fluorescent particles, so that the blue light generated by the blue light LED chip and the ultraviolet light generated by the ultraviolet LED chip generate green light when the green fluorescent particles are excited. As a preferred solution, the mass ratio of the green fluorescent particles to the infrared fluorescent particles can be set to 1:1.

Preferably, the thickness of the first layer of glue powder can be set to 0.6 mm-1.0 mm; the thickness of the second layer of glue powder can be set to 1 cm-1.5 cm, so that ratio of the photon flux density is within the above range.

The blue light and ultraviolet light emitted by the blue light LED chip and the ultraviolet LED chip pass through the fluorescent particles in the first layer of glue powder and the second layer of glue powder, and form a spectrum matching photosynthesis curve after wavelength conversion, and is suitable for the light requirement of different growth stages of plant.

The light emitted by the blue light LED chip has a main wavelength range of 400 nm to 480 nm, and the red fluorescent particles and infrared fluorescent particles in the first layer of glue powder and the second layer of glue powder are respectively excited by the LED blue light to generate red light with the main wavelength range of 600 nm to 680 nm and infrared light with a main wavelength ranging from 700 nm to 750 nm; unexcited blue light and the excited and converted light form a spectrum which conforms to characteristics of plant photosynthesis curve and helps to regulate plant morphology and flowering period.

The light emitted by the ultraviolet LED chip has a main wavelength range of 320 nm to 400 nm, and the red fluorescent particles and infrared fluorescent particles in the first layer of glue powder and the second layer of glue powder are respectively excited by the ultraviolet light to generate red light with the main wavelength range from 600 nm to 680 nm and infrared light with main wavelength range from 700 nm to 750 nm; and unexcited ultraviolet light and the excited and converted light forms a spectrum which conforms to characteristics of plant photosynthesis curve and helps to regulate plant morphology and flowering period.

The blue light LED chip has a light-emitting peak in the range of 400 nm to 480 nm, or is a combination of multi-wavelength blue light LED chips with a light-emitting peak in the range of 400 nm to 480 nm.

The red fluorescent particles adopt one of YAGG, YAGG:$Ce^{3+}$, YAG:$Eu^{2+}$, nitride red fluorescent particles, $Mn^{4+}$ doped $K_2SiF_6$ and $K_2SnF_6$ deep red fluorescent particles or a combination thereof.

The infrared fluorescent particles are one of $Cr^{3+}$, $Ce^{3+}$, $Yb^{3+}$ multi-doped YAG near-infrared fluorescent particles or a combination thereof, such as $Y_3Al_5O_{12}$:Cr, Ce, Yb.

The transparent adhesive medium is one or more of silica gel, epoxy resin, polymethyl methacrylate (PMMA), polycarbonate (PC), or photosensitive colloid. According to different needs, the process of die bond and the potting process adopt the corresponding glue.

In this Example, considering that some fluorescent particles need to work in a low-temperature environment, a thermal insulation coating may be arranged between the first layer of glue powder and the LED chip. Moreover, a layer with better heat dissipation performance such as transparent resin and silica gel can be arranged between the first layer of glue powder and the second layer of glue powder. As another implementation, in this Example, it can be realized by covering a single layer of glue powder on the high-voltage LED chip set. In this case, the high-voltage LED chip can be covered with the mixture of transparent adhesive medium, red phosphor powers and infrared phosphor powers, so that the ratio range of photon number of red light, blue light to infrared light emitted by the high-voltage LED light source for supplementing light to plants per a unit time is 65-95:5-30:1-15; or the ratio range of photon number of red light, blue light, infrared light to ultraviolet light emitted per a unit time is 70-95:5-30:1-15:1-10.

Example 3

This Example provides a lighting equipment including the front-mounted high-voltage LED light source for supplementing light to plants in Examples 1 to 2.

Moreover, the lighting equipment further includes an electrical connector and an LED driver.

The substrate may be made of one of aluminum nitride, a copper substrate, a copper alloy substrate, aluminum oxide, an Epoxy resin membrane plastics, silicon carbide, diamond, silicon, a graphite aluminum substrate, an aluminum-iron alloy substrate, a high thermal conductivity plastic substrate or an aluminum-coated plastic substrate. The substrate made of a material such as aluminum nitride, boron nitride, aluminium oxide, an Epoxy resin membrane plastics, silicon carbide, diamond, silicon, graphite or a nano-carbon material is an opaque substrate. The substrate made of a material such as transparent glass, transparent sapphire, transparent quartz glass, transparent ceramic or transparent plastic is a transparent substrate.

The LED driver is connected to a high-voltage LED chip set. The LED driver is used to drive the high-voltage LED chip sets. The LED driver is connected to an external AC or DC power supply.

The electrical connector is connected to the high-voltage LED chip set, and the electrical connector is connected to an external AC or DC power source to obtain power from power supply equipment such as a power grid through the electrical connector, and directly drive the high-voltage LED chip set.

The front-mounted high-voltage LED light source for supplementing light to plants and the lighting equipment for supplementing light to plants are used in one or more of the following applications: artificial climate chambers, light incubators, plant factories, tissue culture rooms, facility agriculture, and the like.

Example 4

Figure 2:
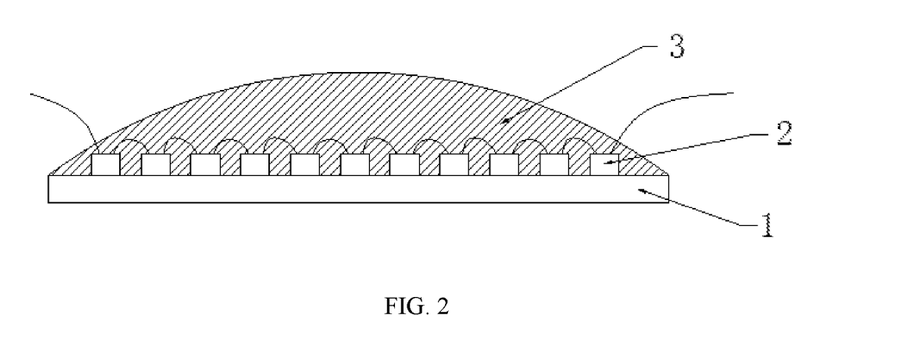
FIG. 2 is a schematic diagram of the structure of the LED light source for supplementing light to plants according to Examples 4-6 of the present disclosure.

This Example discloses a front-mounted high-voltage LED chip set including a plurality of LED chips, the LED chip is a front-mounted LED chip; the front-mounted LED chip includes a substrate layer, and an N—GaN layer, a light-emitting layer, a P—GaN layer and a transparent conductive layer stacked sequentially on the substrate layer; the LED chip is also arranged with a P electrode and an N electrode, the P electrode is arranged on the transparent conductive layer, and the N electrode is arranged on the N—GaN layer.

The LED chips are connected in series, and the P electrode of the LED chip is connected to the N electrode of other LED chip;

or, the LED chips are connected in series and then in parallel, and include at least two parallel-connected LED chip sets, and the P electrodes and the N electrodes of the LED chips in the LED chip sets are connected in series with each other through connecting electrodes;

or, the LED chips are connected in parallel and then in series and includes at least two series-connected LED chip sets, and the P electrodes and the N electrodes of the LED chips in the LED chip sets are connected in parallel to each other through connecting electrodes.

or, the front-mounted high-voltage LED chip set includes only one front-mounted high-voltage LED chip, and the high-voltage LED chip includes a plurality of LED sub-chips connected in series and/or in parallel; the LED sub-chips are blue light LED sub-chips and/or UV LED sub-chips.

The high-voltage LED chip is a front-mounted high-voltage LED chip, and the LED sub-chip of the front-mounted high-voltage LED chip includes a substrate layer, an N—GaN layer, a light-emitting layer, and a P—GaN layer stacked sequentially on the substrate layer; an isolation trench is arranged between the LED sub-chips, and the isolation trench extends to the substrate layer, and an insulating dielectric layer is arranged in the isolation trench; the substrate layers of each of the LED sub-chip forms a whole.

The LED sub-chip is also arranged with a P electrode, an N electrode and an electrical interconnection structure, the P electrode is arranged on the transparent conductive layer, the N electrode is arranged on the N—GaN layer, and the electrical interconnection structure connects the P electrode of one sub-chip to the N electrode of other sub-chip. The electrical interconnection structure is a transparent conductive layer or a metal wire.

The LED sub-chips are connected in series, and the P electrode of the LED sub-chip is connected to the N electrode of other LED sub-chip;

or, the LED sub-chips are connected in series and then in parallel, and include at least two parallel LED sub-chip sets, and the P electrodes and the N electrodes of the LED sub-chips inside the LED sub-chip sets are connected in series with each other through the electrical interconnection structure;

or, the LED sub-chips are connected in parallel and then in series and includes at least two series-connected LED sub-chip sets, and the P electrodes and the N electrodes of the LED sub-chips inside the LED sub-chip sets are connected in parallel with each other through the electrical interconnection structure.

Example 5

This Example provides an LED light source for supplementing light to plants including a substrate 1, a high-voltage LED chip set, and a layer of glue powder 3.

The high-voltage LED chip set adopts the front-mounted high-voltage LED chip set described in Example 4, that is, it may include a plurality of LED chips 2 connected in series and/or in parallel. In this Example, the LED chip 2 includes any one selected from the group comprising: semiconductor light-emitting diodes; organic light-emitting diodes OLED; laser light-emitting diodes QLED and micro-light-emitting diodes Micro-LED. More preferably, the LED chip is a blue light LED chip and/or an ultraviolet LED chip. The blue light LED chip is an LED chip with a light-emitting peak in the range of 400 nm to 480 nm or a combination of blue light LED chips with different wavelengths, and the ultraviolet LED chip is an LED chip with a light-emitting peak in the wavelength range of 320 nm to 400 nm or ultraviolet LEDs with different wavelengths. Herein, the "high voltage" in the present disclosure means that the voltage drop through the LED light source is at least three times voltage drop of one LED light-emitting device in the LED light source.

The upper part of the LED chip 2 is covered with a layer of glue powder 3. In this Example, the layer of glue powder fixes the LED chip on the substrate, and it is a mixture of a transparent adhesive medium and red fluorescent particles, wherein the weight ratio of the transparent adhesive medium and the red fluorescent particles ranges from 100:10 to 100:150, and as a preferred solution, 100:50 or 100:100 can be selected.

Preferably, the red fluorescent particles are at least one of $Mn^{4+}$-activated fluorogermanate phosphors; phosphors having at least one element selected from alkaline earth metal elements and at least one element selected from alkali metal elements in composition and containing such as aluminium oxidete, silicate and phosphate activated by $Eu^{2+}$; phosphors having Al and at least one element selected from Sr and Ca in composition and containing silicon nitride activated by $Eu^{2+}$, such as $CaAlSiN_3$: Eu-based phosphors; phosphors containing sulfide of Ca or Sr activated by $Eu^{2+}$; and phosphors having at least one element or ion selected from alkali metal elements and ammonium ions, $NH^{4+}$ and at least one element selected from elements in Group 4 or Group 14 in composition and containing fluoride activated by $Mn^{4+}$, such as $K_2SiF_6$; or a combination thereof.

Preferably, the red fluorescent particles, such as $Eu^{2+}$-active nitride red fluorescent particles and $Mn^{4+}$-doped $K_2SiF_6$ red fluorescent particles, can cause the light source to emit red light with a main wavelength of 660 nm±20 nm and have a mass ratio of 4:1.

The blue light and the ultraviolet light emitted by the blue light LED chip and the ultraviolet LED chip pass through the red fluorescent particles in the layer of glue powder to form a spectrum matching photosynthesis curve after wavelength conversion, and is suitable for lighting requirements for different growth stages of plant.

The light emitted by the blue light LED chip is a blue light with a main wavelength range of 400 nm to 480 nm, and the red fluorescent particles in the layer of glue powder is excited by the blue light to generate red light with the main wavelength range from 600 nm to 680 nm, and unexcited blue light and the excited and converted light form a spectrum which matches spectrum characteristics of plant photosynthesis.

The light emitted by the ultraviolet LED chip is ultraviolet light with a main wavelength range of 320 nm to 400 nm, and the red fluorescent particles in the layer of glue powder is excited by the ultraviolet light to generate red light with the main wavelength range from 600 nm to 680 nm, and the unexcited ultraviolet light and the excited and converted light form a spectrum which conforms to the characteristics of plant photosynthesis curve.

In this Example, by controlling a weight ratio of the transparent adhesive medium and the red fluorescent particles in the layer of glue powder, as well as thickness of the layer of glue powder; a ratio range of photon number of red light to blue light emitted by the LED light source for supplementing light to plants per a unit time is 65-95:5-35; or a ratio range of red light, blue light to ultraviolet light emitted by the LED light source for supplementing light to plants per a unit time is 70-95:5-30:1-5.

Moreover, yellow fluorescent particles or infrared fluorescent particles can be added to the layer of glue powder. By controlling the ratio of the red fluorescent particles and the infrared fluorescent particles, the ratio range of photon number of red light, blue light to infrared light emitted by the front-mounted high-voltage LED light source for supplementing light to plants per unit time is 55-95:5-30:1-15; or the ratio range of photon number of red light, blue light, infrared light to ultraviolet light emitted by the front-mounted high-voltage LED light source for supplementing light to plants per unit time is 70-95:5-30:1-15:1-10;

or, by controlling the ratio of red fluorescent particles and the yellow fluorescent particles, the ratio range of photon number of red light, blue light to green light (composite light of red and yellow light) emitted by the front-mounted high-voltage LED light source for supplementing light to plants per unit time is 65-95:5-30:5-25; or the ratio range of photon number of red light, blue light, green light to ultraviolet light emitted by the front-mounted high-voltage LED light source for supplementing light to plants per unit time is 70-95:5-30:5-20:1-5.

Preferably, the thickness of the layer of glue powder can be set to 0.6 mm-1.0 mm, so that the ratio of the photon flux density is within the above range.

In addition, the layer of glue powder is also doped with blue fluorescent particles, so that the ultraviolet LED chip can excite blue fluorescent particles to generate blue light with a main wavelength range of 400 nm to 480 nm. When the ultraviolet LED chip accounts for a large proportion of the total LED chips, by the blue light generated by the blue fluorescent particles, the photon number of ultraviolet light is decreased and the photon number of blue light is increased.

Preferably, the content of the blue fluorescent particles in the layer of glue powder may be 10%-30% of the total weight of the layer of glue powder.

The working voltage of the front-mounted LED chip is 9-220V, and a plurality of front-mounted LED chips are connected in series and/or in parallel, driven by an external DC or AC voltage, and the driving voltage is equal to or close to the working voltage of the external AC or DC.

Specifically, the LED chips are connected in series, and the P electrode of the LED chip is connected to the N electrode of other LED chip.

In this Example, considering that some fluorescent particles need to work in a low-temperature environment, a thermal insulation coating may be arranged between the layer of glue powder and the LED chip.

The LED light source for supplementing light to plants of the present disclosure itself has a high working voltage and is easy to achieve the working voltage of the finished product after packaging close to the mains power, thereby improving the conversion efficiency of the drive power. Due to the low working current, the line loss in the finished product application will also be significantly lower than that of the traditional DC LED chip; the working current is small, the heat generated is less, and the thermal resistance is reduced, the stability of light efficiency and the service life of the LED light source is improved. In addition, the LED light source for supplementing light to plants reduces the number of die bond and bonding of the chip, which is beneficial to reduce the cost of packaging.

The high-voltage LED light source for supplementing light to plants can obtain lower thermal resistance than the high-voltage diodes which are generally realized by connecting multiple light-emitting diodes in series, and a smaller heat dissipation module can be used in the manufacture of lamps.

The high-voltage LED chip set adopts low-current drive, which improves the reliability of high-voltage LED devices and reduces the line loss in the application process. At the same time, it can also greatly reduce the design requirements of the heat dissipation shell and the heat dissipation system, and reduce the packaging cost.

The LED light source for supplementing light to plants has two advantages. First, it has the effectively decreased driving cost and weight of the LED lighting lamp. Second, it works at high voltage and low current, and has decreased heat generation, thereby reducing the requirements for the heat dissipation system, and can save heat dissipation materials due to the structure of the lamp.

At the same time, the LED light source for supplementing light to plants can work only with a high-voltage linear constant current source. The high-voltage linear constant current power supply has no transformer and no electrolytic capacitor, which solves the problem of service life of ordinary LED driving power and electrolytic capacitor.

The use of LED light source for supplementing light to plants can greatly simplify the driving power supply and greatly reduce the overall power consumption, thereby greatly reducing the design requirements of the heat dissipation housing, which also means the cost of lighting lamps is effectively reduced.

Example 6

This Example provides a lighting equipment including the LED light source for supplementing light to plants in Example 4.

Moreover, the lighting equipment further includes an electrical connector and an LED driver.

The substrate may be made of one of aluminum nitride, a copper substrate, a copper alloy substrate, aluminum oxide, an Epoxy resin membrane plastics, silicon carbide, diamond, silicon, a graphite aluminum substrate, an aluminum-iron alloy substrate, a high thermal conductivity plastic substrate or an aluminum-coated plastic substrate. The substrate made of a material such as aluminum nitride, boron nitride, aluminium oxide, an Epoxy resin membrane plastics, silicon carbide, diamond, silicon, graphite or a nano-carbon material is an opaque substrate. The substrate made of a material such as transparent glass, transparent sapphire, transparent quartz glass, transparent ceramic or transparent plastic is a transparent substrate.

The LED driver is connected to a high-voltage LED chip set. The LED driver is used to drive the high-voltage LED chip sets. The LED driver is connected to an external AC or DC power supply.

The electrical connector is connected to the high-voltage LED chip set, and the electrical connector is connected to an external AC or DC power source to obtain power from power supply equipment such as a power grid through the electrical connector, and directly drive the high-voltage LED chip set.

The LED light source for supplementing light to plants and the lighting equipment for supplementing light to plants are used in one or more of the following applications: artificial climate chambers, light incubators, plant factories, tissue culture rooms, facility agriculture, and the like.

Example 7

Figure 3:
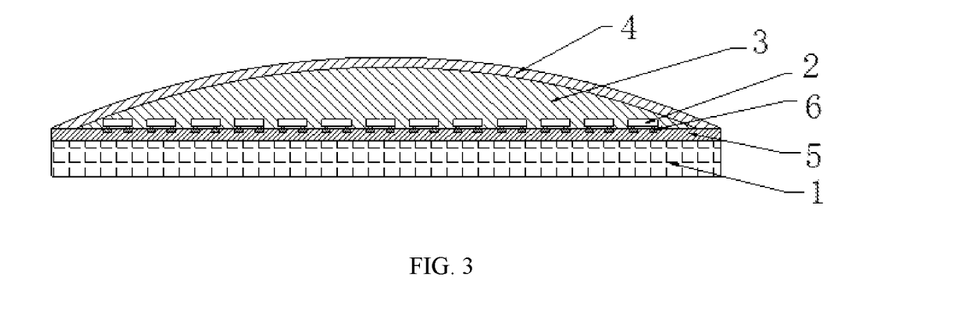
FIG. 3 is a schematic diagram of the structure of the LED light sources for supplementing light to plants according to Examples 6-10 of the present disclosure.

This Example discloses a flip-type high-voltage LED chip set including a plurality of LED chips, the LED chip is a flip-type LED chip; the flip-type LED chip includes a substrate layer, and an N—GaN layer, a light-emitting layer, a P—GaN layer and a transparent conductive layer stacked sequentially under the substrate layer; the LED chip is also arranged with a P electrode bonding pad and an N electrode bonding pad, and the P electrode bonding pad and the N electrode bonding pad are on the same side of the chip. The P electrode bonding pad is arranged on the transparent conductive layer, and the N electrode bonding pad is arranged on the N—GaN layer, and the P electrode bonding pad and the N electrode bonding pad are electrically isolated from each other. Each of the LED chips is flip-type welded on the substrate, and interconnected through a printed circuit on the substrate.

The LED chips are connected in series, and the P electrode bonding pad of the LED chip is connected to the N electrode bonding pad of other LED chip;

or, the LED chips are connected in series and then in parallel and includes at least two parallel-connected LED chip sets, and the P electrode bonding pads and the N electrode bonding pads of the LED chips inside the LED chip sets are connected in series with each other through connecting electrodes;

or, the LED chips are connected in parallel and then in series and includes at least two series-connected LED chip sets, and the P electrode bonding pads and the N electrode bonding pads of the LED chips inside the LED chip sets are connected in parallel to each other through connecting electrodes.

Example 8

This Example provides a LED light source for supplementing light to including a substrate, a high-voltage LED chip set, a first layer of glue powder, and a second layer of glue powder.

The high-voltage LED chip set adopts the flip-type high-voltage LED chip set described in Example 7; that is, it includes a plurality of LED chips connected in series and/or in parallel. In this Example, the LED chip is any one selected from the group consisted of: semiconductor light-emitting diodes; organic light-emitting diodes, OLED; quantum dot light emitting diode, QLED; and micro light emitting diode, Micro-LED. More preferably, the LED chip is a blue light LED chip and/or an ultraviolet LED chip, and the blue light LED chip is an LED chip with a light-emitting peak in a range of 400 nm to 480 nm or a combination of blue light LED chips with different wavelengths, and the ultraviolet LED chip is an LED chip with a light-emitting peak in a wavelength range of 320 nm to 400 nm or a combination of ultraviolet LED chips with different wavelengths. Herein, the "high voltage" in the present disclosure means that the voltage drop through the LED light source is at least three times more than that of voltage drop of one LED light-emitting device in the LED light source.

An insulating layer is formed on the substrate, a printed circuit is formed on the insulating layer, and the P electrode bonding pad and the N electrode bonding pad of the high-voltage LED chip are welded on the printed circuit. Thus, the series connection and parallel connection of the LED chips is realized through the printed circuit.

The upper part of the LED chip is covered with the first layer of glue powder. In this Example, the first layer of glue powder fixes the LED chip on the substrate, and it is a mixture of a transparent adhesive medium and red fluorescent particles, wherein, the weight ratio of the transparent adhesive medium and the red fluorescent particles ranges from 100:10 to 100:150, and as a preferred solution, 100:50 or 100:100 can be selected.

The second layer of glue powder covers the first layer of glue powder and completely coats the first layer of glue powder. In this Example, the second layer of glue powder is a transparent adhesive medium and yellow fluorescent particles, the weight ratio of the transparent adhesive medium and the yellow fluorescent particles ranges from 100:40 to 100:60, and preferably, the weight ratio of the transparent adhesive medium and the yellow fluorescent particles is 100:50.

The second layer of glue powder may also be doped with some green fluorescent particles, so that the blue light generated by the blue light LED chip and the ultraviolet light generated by the ultraviolet LED chip generate green light when the green fluorescent particles are excited. As a preferred solution, the mass ratio of the green fluorescent particles to the yellow fluorescent particles can be set to 1:1.

The blue light and the ultraviolet light emitted by the blue light LED chip and the ultraviolet LED chip pass through the fluorescent particles in the first layer of glue powder and the second layer of glue powder to form a spectrum matching photosynthesis curve after wavelength conversion, and is suitable for lighting requirements for different growth stages of plant.

The light emitted by the blue light LED chip is a blue light with a main wavelength range of 400 nm to 480 nm, and the red fluorescent particles and yellow fluorescent particles in the first layer of glue powder and the second layer of glue powder are respectively excited by the blue light to generate red light with the main wavelength range from 600 nm to 680 nm and green light with a main wavelength range from 490 nm to 590 nm, and unexcited blue light and the excited and converted light form a spectrum which matches spectrum characteristics of plant photosynthesis.

The light emitted by the ultraviolet LED chip is ultraviolet light with a main wavelength range of 32.0 nm to 400 nm, and the red fluorescent particles and yellow fluorescent particles in the first layer of glue powder and the second layer of glue powder are respectively excited by the ultraviolet light to generate red light with the main wavelength range from 600 nm to 680 nm and green light with main wavelength range from 490 nm to 590 nm, and the unexcited ultraviolet light and the excited and converted light form a spectrum which conforms to characteristics of plant photosynthesis curve.

Preferably, the red fluorescent particles are at least one of $Mn^{4+}$-activated fluorogermanate phosphors; phosphors having at least one element selected from alkaline earth metal elements and at least one element selected from alkali metal elements in composition and containing such as aluminium oxidete, silicate and phosphate activated by $Eu^{2+}$; phosphors having Al and at least one element selected from Sr and Ca in composition and containing silicon nitride activated by $Eu^{2+}$, such as $CaAlSiN_3$: Eh-based phosphors; phosphors containing sulfide of Ca or Sr activated by $Eu^{2+}$; and phosphors having at least one element or ion selected from alkali metal elements and ammonium ions, $NH_4^+$ and at least one element selected from elements in Group 4 or Group 14 in composition and containing fluoride activated by $Mn4^+$, such as $K_2SiF_6$; or a combination thereof.

Preferably, the red fluorescent particles, such as $Eu^{2+}$-active nitride red fluorescent particles and $Mn^{4+}$-doped $K_2SiF_6$ red fluorescent particles, can cause the light source to emit red light with a main wavelength of 660 nm±20 nm and have a mass ratio of 4:1.

In this Example, by controlling the weight ratio of the transparent adhesive medium and the red fluorescent particles in the first layer of glue powder, as well as thickness of the first layer of glue powder; and by controlling the weight ratio of the transparent adhesive medium and the yellow fluorescence particles in the second layer of glue powder, as well as thickness of the second layer of glue powder, a ratio range of photon number of red light to blue light emitted by the flip-type high-voltage LED light source for supplementing light to plants per a unit time is 65-95: 5-35; or a ratio range of red light, blue light, to green light emitted by the flip-type high-voltage LED light source for supplementing light to plants per a unit time is 65-95:5-30: 5-25; or a ratio range of red light, blue light, to ultraviolet light emitted by the flip-type high-voltage LED light source for supplementing light to plants per a unit time is 70-95: 5-30:1-5.

Preferably, the thickness of the first layer of glue powder can be set to 0.6 mm-1.0 mm, and the thickness of the second layer of glue powder can be set to 1 cm-1.5 cm, so that the ratio of the photon flux density is within the above range.

In addition, the first layer of glue powder and/or the second layer of glue powder are also doped with blue fluorescent particles, so that the ultraviolet LED chip can excite blue fluorescent particles to generate blue light with a main wavelength range of 400 nm to 480 nm. When the ultraviolet LED chip accounts for a large proportion of the total LED chips, by the blue light generated by the blue fluorescent particles, the photon number of ultraviolet light is decreased and the photon number of blue light is increased.

Preferably, the content of the blue fluorescent particles in the first layer of glue powder and the second layer of glue powder may be 10%-30% of the total weight of the first layer of glue powder and the second layer of glue powder.

In this Example, the LED chip is a flip-type LED chip, and the LED chip includes a substrate layer, and an N—GaN layer, a light-emitting layer, a P—GaN layer, and a transparent conductive layer stacked sequentially under the substrate layer. The LED chip is further arranged with a P electrode bonding pad and an N electrode bonding pad, the P electrode bonding pad is arranged on the transparent conductive layer, and the N electrode bonding pad is arranged on the N—GaN layer; and the P electrode bonding pad and the N electrode bonding pad are electrically isolated from each other; each of the LED chips is flip-type welded on the substrate and interconnected by the printed circuit on the substrate.

The working voltage of the flip-type LED chip is 9-220V, and a plurality of flip-type LED chips are connected in series and/or in parallel, driven by an external DC or AC voltage, and the driving voltage is equal to or close to the working voltage of the external AC or DC.

Specifically, the LED chips are connected in series, and the P electrode bonding pad of the LED chip is connected to the N electrode bonding pad of other LED chip;

or, the LED chips are connected in series and then in parallel, and include at least two parallel-connected LED chip sets, and the P electrode bonding pad and the N electrode bonding pad of the LED chips in the LED chip sets are connected in series with each other through the connecting electrodes;

or, the LED chips are connected in parallel and then in series and includes at least two series-connected LED chip sets, and the P electrode bonding pad and the N electrode bonding pad of the LED chips in the LED chip sets are connected in parallel to each other through the connecting electrodes.

In this Example, considering that some fluorescent particles need to work in a low-temperature environment, a thermal insulation coating may be arranged between the first layer of glue powder and the LED chip. Moreover, a layer with better heat dissipation performance such as transparent resin and silica gel can be set in between the first layer of glue powder and the second layer of glue powder.

As another implementation, in this Example, it can be achieved by covering a single layer of glue powder on the high-voltage LED chip set. At this time, High-voltage LED chip set can be covered with the mixture of transparent adhesive medium, red phosphor powder and yellow phosphor powder, so that the ratio range of photon number of the red light, blue light to green light emitted by the high-voltage LED light source for supplementing light to plants per a unit time is 65-95:5-30:5-25, or the ratio range of photon number of red light, blue light, green light to ultraviolet light emitted per a unit time is 70-95:5-30:5-25:1-5.

The LED light source for supplementing light to plants of the present disclosure itself has a high working voltage and is easy to achieve the working voltage of the finished product after packaging close to the mains power, thereby improving the conversion efficiency of the drive power. Due to the low working current, the line loss in the finished product application will also be significantly lower than that of the traditional DC LED chip; the working current is small, the heat generated is less, and the thermal resistance is reduced, the stability of light efficiency and the service life of the LED light source is improved. In addition, the LED light source for supplementing light to plants reduces the number of die bond and bonding of the chip, which is beneficial to reduce the cost of packaging.

The LED light source for supplementing light to plants can obtain lower thermal resistance than the high-voltage diodes which are generally realized by connecting multiple light-emitting diodes in series, and a smaller heat dissipation module can be used in the manufacture of lamps.

The high-voltage LED chip set adopts low-current drive, which improves the reliability of high-voltage LED devices and reduces the line loss in the application process. At the same time, it can also greatly reduce the design requirements of the heat dissipation shell and the heat dissipation system, and reduce the packaging cost.

The LED light source for supplementing light to plants has two advantages. First, it has the effectively decreased driving cost and weight of the LED lighting lamp. Second, it works at high voltage and low current, and has decreased heat generation, thereby reducing the requirements for the heat dissipation system, and can save heat dissipation materials due to the structure of the lamp.

At the same time, the LED light source for supplementing light to plants can work only with a high-voltage linear constant current source. The high-voltage linear constant current power supply has no transformer and no electrolytic capacitor, which solves the problem of service life of ordinary LED driving power and electrolytic capacitor.

The use of the LED light source for supplementing light to plants can greatly simplify the driving power supply and greatly reduce the overall power consumption, thereby greatly reducing the design requirements of the heat dissipation housing, which also means the cost of lighting lamps is effectively reduced.

Example 9

This Example provides a LED light source for supplementing light to plants. The difference from Example 7 is in that infrared fluorescent particles are used to replace yellow fluorescent particles. At this time, a weight ratio of the transparent adhesive medium and the infrared fluorescent particles ranges from 100:40 to 100:60, and preferably, the weight ratio of the transparent adhesive medium and the infrared fluorescent particles is 100:50.

In this Example, by controlling the weight ratio of the transparent adhesive medium and the red fluorescent particles in the first layer of glue powder, as well as thickness of the first layer of glue powder; and by controlling the transparent adhesive medium and infrared fluorescence particles in the second layer of glue powder, as well as thickness of the second layer of glue powder, the ratio range of photon number of red light to blue light emitted by the high-voltage LED light source for supplementing light to plants per a unit time is 70-95:5-30; or the ratio range of photon number of red light, blue light to infrared light emitted by the high-voltage LED light source for supplementing light to plants per a unit time is 65-95:5-30:1-15; or the ratio range of photon number of red light, blue light to ultraviolet light emitted by the high-voltage LED light source for supplementing light to plants per a unit time is 70-95:5-30:1-10.

The second layer of glue powder may also be doped with some green fluorescent particles, so that the blue light generated by the blue light LED chip and the ultraviolet light generated by the ultraviolet LED chip generate green light when the green fluorescent particles are excited. As a preferred solution, the mass ratio of the green fluorescent particles to the infrared fluorescent particles can be set to 1:1.

Preferably, the thickness of the first layer of glue powder can be set to 0.6 mm-1.0 mm; the thickness of the second layer of glue powder can be set to 1 cm-1.5 cm, so that the ratio of the photon flux density is within the above range.

The blue light and ultraviolet light emitted by the blue light LED chip and the ultraviolet LED chip pass through the fluorescent particles in the first layer of glue powder and the second layer of glue powder, and form a spectrum matching photosynthesis curve after wavelength conversion, and is suitable for the light requirement of different growth stages of plant.

The light emitted by the blue light LED chip has a main wavelength range of 400 nm to 480 nm, and the red fluorescent particles and infrared fluorescent particles in the first layer of glue powder and the second layer of glue powder are respectively excited by the LED blue light to generate red light with the main wavelength range of 600 nm to 680 nm and infrared light with a main wavelength ranging from 700 nm to 750 nm; unexcited blue light and the excited and converted light form a spectrum which conforms to characteristics of plant photosynthesis curve and helps to regulate plant morphology and flowering period.

The light emitted by the ultraviolet LED chip has a main wavelength range of 320 nm to 400 nm, and the red fluorescent particles and infrared fluorescent particles in the first layer of glue powder and the second layer of glue powder are respectively excited by the ultraviolet light to generate red light with the main wavelength range from 600 nm to 680 nm and infrared light with main wavelength range from 700 nm to 750 nm; and unexcited ultraviolet light and the excited and converted light forms a spectrum which conforms to characteristics of plant photosynthesis curve and helps to regulate plant morphology and flowering period.

The blue light LED chip has a light-emitting peak in the range of 400 nm to 480 nm, or is a combination of multi-wavelength blue light LED chips with a light-emitting peak in the range of 400 nm to 480 nm.

The red fluorescent particles adopt one of YAGG, YAGG: $Ce^{3+}$, YAG: $Eu^{2+}$, nitride red fluorescent particles, $Mn^{4+}$ doped $K_2SiF_6$ and $K_2SnF_6$ deep red fluorescent particles or a combination thereof.

The infrared fluorescent particles are one of $Cr^{3+}$, $Ce^{3+}$, $Yb^{3+}$ multi-doped YAG near-infrared fluorescent particles or a combination thereof, such as $Y_3Al_5O_{12}$:Cr, Ce, Yb.

The transparent adhesive medium is one or more of silica gel, epoxy resin, polymethyl methacrylate (PMMA), polycarbonate (PC), or photosensitive colloid. According to different needs, the process of die bond and the potting process adopt the corresponding glue.

In this Example, considering that some fluorescent particles need to work in a low-temperature environment, a thermal insulation coating may be arranged between the first layer of glue powder and the LED chip. Moreover, a layer with better heat dissipation performance such as transparent resin and silica gel can be arranged between the first layer of glue powder and the second layer of glue powder.

As another implementation, in this Example, it can be realized by covering a single layer of glue powder on the high-voltage LED chip set. In this case, The high-voltage LED chip can be covered with the mixture of transparent adhesive medium, red phosphor powers and infrared phosphor powers, so that the ratio range of photon number of red light, blue light to infrared light emitted by the high-voltage LED light source for supplementing light to plants per a unit time is 65-95:5-30:1-15; or the ratio range of photon number of red light, blue light, infrared light to ultraviolet light emitted per a unit time is 70-95:5-30:1-15:1-10.

Example 10

This Example provides a lighting equipment including the LED light source for supplementing light to plants in Examples 7 to 9.

Moreover, the lighting equipment further includes an electrical connector and an LED driver.

The substrate may be made of one of aluminum nitride, a copper substrate, a copper alloy substrate, aluminum oxide, an Epoxy resin membrane plastics, silicon carbide, diamond, silicon, a graphite aluminum substrate, an aluminum-iron alloy substrate, a high thermal conductivity plastic substrate or an aluminum-coated plastic substrate. The substrate made of a material such as aluminum nitride, boron nitride, aluminium oxide, an Epoxy resin membrane plastics, silicon carbide, diamond, silicon, graphite or a nano-carbon material is an opaque substrate. The substrate made of a material such as transparent glass, transparent sapphire, transparent quartz glass, transparent ceramic or transparent plastic is a transparent substrate.

The LED driver is connected to a high-voltage LED chip set. The LED driver is connected to a printed circuit of the substrate and is used to drive the high-voltage LED chip sets. The LED driver is connected to an external AC or DC power supply.

The electrical connector is connected to the high-voltage LED chip set, and the electrical connector is connected to an external AC or DC power source to obtain power from power supply equipment such as a power grid through the electrical connector, and directly drive the high-voltage LED chip set.

The front-mounted high-voltage LED light source for supplementing light to plants and the lighting equipment for supplementing light to plants are used in one or more of the following applications: artificial climate chambers, light incubators, plant factories, tissue culture rooms, facility agriculture, and the like.

Example 11

Figure 4:
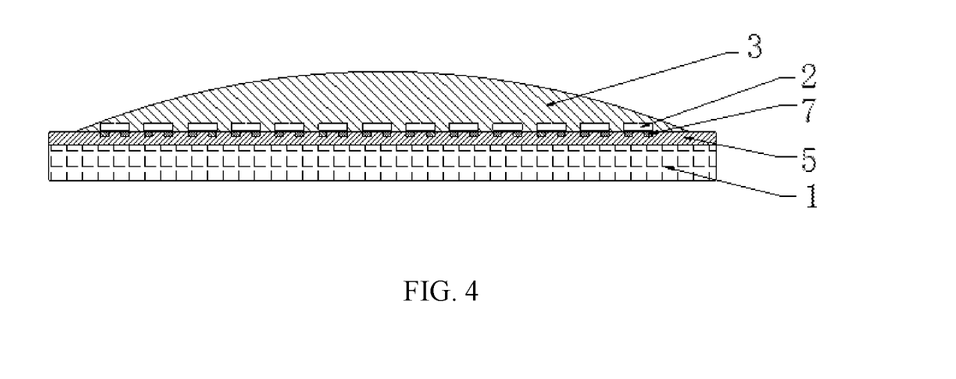
FIG. 4 is a schematic diagram of the structure of the LED light sources for supplementing light to plants according to Examples 11-12 of the present disclosure.

This Example provides the flip-type high-voltage LED light source for supplementing light to plants including a substrate 1, a high-voltage LED chip set, and a layer of glue powder 3.

The high-voltage LED chip set includes a plurality of LED chips 2 connected in series and/or in parallel. In this Example, the LED chip 2 includes any one selected from the group comprising: semiconductor light-emitting diodes; organic light-emitting diodes OLED; quantum light-emitting diodes QLED and micro-light-emitting diodes Micro-LED. More preferably, the LED chip is a blue light LED chip and/or an ultraviolet LED chip. The blue light LED chip is an LED chip with a light-emitting peak in the range of 400 nm to 480 nm or a combination of blue light LED chips with different wavelengths, and the ultraviolet LED chip is an LED chip with a light-emitting peak in the wavelength range of 320 nm to 400 nm or ultraviolet LEDs with different wavelengths. Herein, the "high voltage" in the present disclosure means that the voltage drop through the LED light source is at least three times voltage drop of one LED light-emitting device in the LED light source.

An insulating layer 5 is formed on the substrate 1, a connecting circuit 7 (printed circuit) is formed on the insulating layer 5, and the P electrode bonding pad and the N electrode bonding pad of the high-voltage LED chip are welded on the connecting circuit, so that the series and parallel connection of LED chips is realized by the connection circuit.

The upper part of the LED chip 2 is covered with a layer of glue powder 3. In this Example, the layer of glue powder fixes the LED chip on the substrate, and it is a mixture of a transparent adhesive medium and red fluorescent particles, wherein the weight ratio of the transparent adhesive medium and the red fluorescent particles ranges from 100:10 to 100:150, and as a preferred solution, 100:50 or 100:100 can be selected.

Preferably, the red fluorescent particles are at least one of $Mn^{4+}$-activated fluorogermanate phosphors; phosphors having at least one element selected from alkaline earth metal elements and at least one element selected from alkali metal elements in composition and containing such as aluminium oxidete, silicate and phosphate activated by $Eu^{2+}$; phosphors having Al and at least one element selected from Sr and Ca in composition and containing silicon nitride activated by $Eu^{2+}$, such as $CaAlSiN_3$: Eu-based phosphors; phosphors containing sulfide of Ca or Sr activated by $Eu^{2+}$; and phosphors having at least one element or ion selected from alkali metal elements and ammonium ions, $NH^{4+}$ and at least one element selected from elements in Group 4 or Group 14 in composition and containing fluoride activated by $Mn^{4+}$, such as $K_2SiF_6$; or a combination thereof.

Preferably, the red fluorescent particles, such as $Eu^{2+}$-active nitride red fluorescent particles and $Mn^{4+}$-doped $K_2SiF_6$ red fluorescent particles, can cause the light source to emit red light with a main wavelength of 660 nm±20 nm and have a mass ratio of 4:1.

The blue light and the ultraviolet light emitted by the blue light LED chip and the ultraviolet LED chip pass through the red fluorescent particles in the layer of glue powder to form a spectrum matching photosynthesis curve after wavelength conversion, and is suitable for lighting requirements for different growth stages of plant.

the light emitted by the blue light LED chip is a blue light with a main wavelength range of 400 nm to 480 nm, and the red fluorescent particles in the layer of glue powder is excited by the blue light to generate red light with the main wavelength range from 600 nm to 680 nm, and unexcited blue light and the excited and converted light form a spectrum which matches spectrum characteristics of plant photosynthesis. The quantum flux density of red light is greater than that of blue light and ultraviolet light.

The light emitted by the ultraviolet LED chip is ultraviolet light with a main wavelength range of 320 nm to 400 nm, and the red fluorescent particles in the layer of glue powder is excited by the ultraviolet light to generate red light with the main wavelength range from 600 nm to 680 nm, and the unexcited ultraviolet light and the excited and converted light form a spectrum which conforms to the characteristics of plant photosynthesis curve.

In this Example, by controlling a weight ratio of the transparent adhesive medium and the red fluorescent particles in the layer of glue powder, as well as thickness of the layer of glue powder; a ratio range of photon number of red light to blue light emitted by the flip-type high-voltage LED light source for supplementing light to plants per a unit time is 65-95:5-35; or a ratio range of red light, blue light to ultraviolet light emitted by the LED light source for supplementing light to plants per a unit time is 70-95:5-30:1-5.

Moreover, yellow fluorescent particles or infrared fluorescent particles can be added to the layer of glue powder. By controlling the ratio of the red fluorescent particles and the infrared fluorescent particles, the ratio range of photon number of red light, blue light to infrared light emitted by the front-mounted high-voltage LED light source for supplementing light to plants per unit time is 65-95:5-30:1-15; or the ratio range of photon number of red light, blue light, infrared light to ultraviolet light emitted by the front-mounted high-voltage LED light source for supplementing light to plants per unit time is 70-95:5-30:1-15:1-10;

or, by controlling the ratio of red fluorescent particles and the yellow fluorescent particles, the ratio range of photon number of red light, blue light to green light (composite light of red and yellow light) emitted by the front-mounted high-voltage LED light source for supplementing light to plants per unit time is 65-95:5-30:5-25; or the ratio range of photon number of red light, blue light, green light to ultraviolet light emitted by the front-mounted high-voltage LED light source for supplementing light to plants per unit time is 70-95:5-30:5-20:1-5.

Preferably, the thickness of the layer of glue powder can be set to 0.6 mm-1.0 mm, so that the ratio of the photon flux density is within the above range.

In addition, the layer of glue powder is also doped with blue fluorescent particles, so that the ultraviolet LED chip can excite blue fluorescent particles to generate blue light with a main wavelength range of 400 nm to 480 nm. When the ultraviolet LED chip accounts for a large proportion of the total LED chips, by the blue light generated by the blue fluorescent particles, the photon number of ultraviolet light is decreased and the photon number of blue light is increased.

Preferably, the content of the blue fluorescent particles in the layer of glue powder may be 10%-30% of the total weight of the layer of glue powder.

The adhesive medium such as thermoplastic resin, thermosetting resin, and silica gel can be used. In addition to phosphors and sealing materials, the adhesive medium may contain other components such as a filler, a light stabilizer, a colorant. Examples of the filler include silica, barium titanate, titanium oxide, and aluminum oxide and the like.

In this example, the LED chip is a flip-chip LED chip, and the LED chip includes a substrate layer, and an N—GaN layer, a light-emitting layer, a P—GaN layer and a transparent conductive layer stacked sequentially under the substrate layer. The LED chip is further provided with a P electrode bonding pad and an N electrode bonding pad, the P electrode bonding pad is provided on the transparent conductive layer, and the N electrode bonding pad is provided on the N—GaN layer; and the P electrode bonding pad and the N electrode bonding pad are electrically isolated from each other; each of the LED chips is flip-chip welded on the substrate and interconnected through connection circuit on the substrate.

The working voltage of the flip-type high-voltage LED chip is 9-220V and a plurality of flip-type high-voltage LED chips are connected in series and/or in parallel, driven by an external DC or AC voltage, and the driving voltage is equal to or close to the working voltage of the external AC or DC.

Specifically, the LED chips are connected in series, and the P electrode bonding pad of the LED chip is connected to the N electrode bonding pad of other LED chip;

or, the LED chips are connected in series and then in parallel, and comprises at least two parallel-connected LED chip sets, and the P electrode bonding pads and the N electrode bonding pads of the LED chips inside the LED chip sets are connected in series with each other through connecting electrodes;

or, the LED chips are connected in parallel and then in series and comprises at least two series-connected LED chip sets, and the P electrode bonding pads and the N electrode bonding pads of the LED chips inside the LED chip sets are connected in parallel to each other through connecting electrodes;

or, the high-voltage LED chip set may include only one high-voltage LED chip, and the high-voltage LED chip includes a plurality of LED sub-chips connected in series and/or in parallel. The LED chip is a blue LED chip and/or ultraviolet LED chip.

The high-voltage LED chip is a flip-chip high-voltage LED chip.

An isolation trench is arranged between the LED sub-chips, and the isolation trench extends to the substrate layer, and an insulating dielectric layer is arranged in the isolation trench.

The LED sub-chip includes a substrate layer, an N—GaN layer, a light-emitting layer, and a P—GaN layer stacked sequentially on the substrate layer.

The LED sub-chip is also provided with a P electrode bonding pad and an N electrode bonding pad, and the P electrode bonding pad and the N electrode bonding pad are on the same side of the chip, and the P electrode bonding pad is arranged on the transparent conductive layer, and the N electrode bonding pad is arranged on the N—GaN layer, and the P electrode bonding pad and the N electrode bonding pad are electrically isolated from each other;

The N electrode and the P electrode between the adjacent LED sub-chips are sequentially connected by a metal conductive film, and the metal conductive film is covered with an insulating layer.

The LED sub-chips are connected in series, and the P electrode boniding pad of the LED sub-chip is connected to the N electrode bonding pad of other LED sub-chip through a metal conductive film;

or, the LED sub-chips are connected in series and then in parallel, and include at least two parallel LED sub-chip sets, and the P electrode bonding pad and the N electrode bonding pad of the LED sub-chips inside the LED sub-chip sets are connected in series through the metal conductive film;

or, the LED sub-chips are connected in parallel and then in series, and includes at least two series LED sub-chip sets, and the P electrode bonding pad and the N electrode bonding pad of the LED sub-chips inside the LED sub-chip group are connected in parallel with each other through the connecting electrodes connect.

In this Example, considering that some fluorescent particles need to work in a low-temperature environment, a thermal insulation coating may be arranged between the layer of glue powder and the LED chip.

The flip-type high-voltage LED light source for supplementing light to plants of the present disclosure itself has a high working voltage and is easy to achieve the working voltage of the finished product after packaging close to the mains power, thereby improving the conversion efficiency of the drive power. Due to the low working current, the line loss in the finished product application will also be significantly lower than that of the traditional DC LED chip; the working current is small, the heat generated is less, and the thermal resistance is reduced, the stability of light efficiency and the service life of the LED light source is improved. In addition, the flip-type high-voltage LED light source for supplementing light to plants reduces the number of die bond and bonding of the chip, which is beneficial to reduce the cost of packaging.

The flip-type high-voltage LED light source for supplementing light to plants can obtain lower thermal resistance than the high-voltage diodes which are generally realized by connecting multiple light-emitting diodes in series, and a smaller heat dissipation module can be used in the manufacture of lamps.

The high-voltage. LED chip adopts low-current drive, which improves the reliability of high-voltage LED devices and reduces the line loss in the application process. At the same time, it can also greatly reduce the design requirements of the heat dissipation shell and the heat dissipation system, and reduce the packaging cost.

The flip-type high-voltage LED light source for supplementing light to plants has two advantages. First, it improves the light output efficiency of LED light source, and has the effectively decreased driving cost and weight of the LED lighting lamp. Second, it works at high voltage and low current, and has decreased heat generation, thereby reducing the requirements for the heat dissipation system, and can save heat dissipation materials due to the structure of the lamp.

At the same time, the flip-type high-voltage LED light source for supplementing light to plants can work only with a high-voltage linear constant current source. The high-voltage linear constant current power supply has no transformer and no electrolytic capacitor, which solves the problem of service life of ordinary LED driving power and electrolytic capacitor.

The use of the flip-type high-voltage LED light source for supplementing light to plants can greatly simplify the driving power supply and greatly reduce the overall power consumption, thereby greatly reducing the design requirements of the heat dissipation housing, which also means the cost of lighting lamps is effectively reduced.

Example 12

This Example provides a lighting equipment including the flip-type high-voltage LED light source for supplementing light to plants in Examples 11.

Moreover, the lighting equipment further includes an electrical connector and an LED driver.

The substrate may be made of one of aluminum nitride, a copper substrate, a copper alloy substrate, aluminum oxide, an Epoxy resin membrane plastics, silicon carbide, diamond, silicon, a graphite aluminum substrate, an aluminum-iron alloy substrate, a high thermal conductivity plastic substrate or an aluminum-coated plastic substrate. The substrate made of a material such as aluminum nitride, boron nitride, aluminium oxide, an Epoxy resin membrane plastics, silicon carbide, diamond, silicon, graphite or a nano-carbon material is an opaque substrate. The substrate made of a material such as transparent glass, transparent sapphire, transparent quartz glass, transparent ceramic or transparent plastic is a transparent substrate.

The LED driver is connected to a high-voltage LED chip set. The LED driver is connected to a connecting circuit of the substrate, and is used to drive the high-voltage LED chip sets. The LED driver is connected to an external AC or DC power supply, wherein, the connecting circuit on the substrate may be a printed circuit.

The electrical connector is connected to the high-voltage LED chip set, and the electrical connector is connected to an external AC or DC power source to obtain power from power supply equipment such as a power grid through the electrical connector, and directly drive the high-voltage LED chip set.

The front-mounted high-voltage LED light source for supplementing light to plants and the lighting equipment for supplementing light to plants are used in one or more of the following applications: artificial climate chambers, light incubators, plant factories, tissue culture rooms, facility agriculture, and the like.

What is claimed is:

1. A front-mounted high-voltage LED light source for supplementing light to plants, comprising a substrate, a high-voltage LED chip set, a first layer of glue powder and a second layer of glue powder; wherein
   the high-voltage LED chip set comprises a plurality of LED chips connected in series and/or in parallel; the plurality of LED chips are configured as blue light LED chips and/or ultraviolet LED chips;
   an upper part of each of the plurality of LED chips is covered with the first layer of glue powder; the first layer of glue powder fixes the plurality of LED chips on the substrate and is a mixture of a transparent adhesive medium and red fluorescent particles;
   the second layer of glue powder covers the first layer of glue powder and completely coats the first layer of glue powder; the second layer of glue powder is a mixture of the transparent adhesive medium and yellow fluorescent particles;
   by controlling a weight ratio of the transparent adhesive medium and the red fluorescent particles in the first layer of glue powder, as well as a thickness of the first layer of glue powder; and by controlling a weight ratio of the transparent adhesive medium and the yellow fluorescent particles in the second layer of glue powder, as well as a thickness of the second layer of glue powder, a ratio range of photon number of red light, blue light to green light emitted by the front-mounted high-voltage LED light source for supplementing the light to the plants per a unit time is (65-95):(5-30):(5-25); or a ratio range of photon number of the red light, the blue light, the green light to ultraviolet light emitted by the front-mounted high-voltage LED light source for supplementing the light to the plants per a unit time is (70-95):(5-30):(5-20):(1-5).

2. The front-mounted high-voltage LED light source according to claim 1,
wherein the blue light emitted by the blue light LED chips and the ultraviolet light emitted by the ultraviolet LED chips pass through the red fluorescent particles in the first layer of glue powder and the yellow fluorescent particles in the second layer of glue powder to form a spectrum matching photosynthesis curve after a wavelength conversion, and the spectrum is suitable for lighting requirements of different growth stages of the plants;
when the second layer of glue powder comprises the yellow fluorescent particles, the blue light LED chips emit blue light with a main wavelength ranging from 400 nm to 480 nm, and the red fluorescent particles in the first layer of glue powder and the yellow fluorescent particles in the second layer of glue powder are respectively excited by the blue light to generate red light with a main wavelength range of 600 nm to 680 nm and green light with a main wavelength range of 490 nm to 590 nm; and unexcited blue light and excited and converted light form the spectrum, wherein the spectrum matches spectrum characteristics of plant photosynthesis;
when the second layer of glue powder comprises the yellow fluorescent particles, the ultraviolet LED chips emit ultraviolet light with a main wavelength ranging from 320 nm to 400 nm, and the red fluorescent particles in the first layer of glue powder and the yellow fluorescent particles in the second layer of glue powder are respectively excited by the ultraviolet light to generate the red light with the main wavelength range of 600 nm to 680 nm and the green light with the main wavelength range of 490 nm to 590 nm; and, the unexcited ultraviolet light and the excited and converted light form the spectrum, wherein the spectrum conforms to the characteristics of the plant photosynthesis curve.

3. The front-mounted high-voltage LED light source according to claim 2, wherein the blue light LED chips is are LED chips with a light-emitting peak in the range of 400 nm to 480 nm or a combination of the blue light LED chips with different wavelengths; and the ultraviolet LED chips are LED chips with a light-emitting peak in the wavelength range of 320 nm to 400 nm or a combination of the ultraviolet LED chips with different wavelengths.

4. The front-mounted high-voltage LED light source according to claim 3, wherein each of the plurality of LED chips is a front-mounted LED chip, and
each of the plurality of LED chips comprises a substrate layer and an N-GaN layer, a light-emitting layer, a P-GaN layer and a transparent conductive layer stacked sequentially on the substrate layer; and
each of the plurality of LED chips is also arranged with a P electrode and an N electrode, the P electrode is arranged on the transparent conductive layer, and the N electrode is arranged on the N-GaN layer.

5. The front-mounted high-voltage LED light source according to claim 4, wherein a working voltage of the LED chips is 9-220V, and the plurality of LED chips are connected in series and/or in parallel, and driven by an external AC or DC voltage, and a driving voltage is equal to or close to a working voltage of an external AC or DC.

6. The front-mounted high-voltage LED light source according to claim 5, wherein the LED chips are connected in series, and the P electrode of each of the LED chips is connected to the N electrode of another LED chip.

7. The front-mounted high-voltage LED light source according to claim 5, wherein the plurality of LED chips are connected in series and then in parallel, and comprise at least two parallel-connected LED chip sets, and the P electrodes and the N electrodes of the plurality of LED chips in each of the at least two parallel-connected LED chip sets are connected in series with each other through connecting electrodes.

8. The front-mounted high-voltage LED light source according to claim 5, wherein the plurality of LED chips are connected in parallel and then in series, and comprise at least two series-connected LED chip sets, and the P electrodes and the N electrodes of the plurality of LED chips in each of the at least two series-connected LED chip sets are connected in parallel to each other through connecting electrodes.

9. An LED light source for supplementing light to plants, comprising a substrate, a high-voltage LED chip set and a layer of glue powder;
wherein, the high-voltage LED chip set is a front-mounted high-voltage LED chip set; and the high-voltage LED chip set comprise the blue light LED chips and/or the ultraviolet LED chips; and
an upper part of each of the blue light LED chips and/or the ultraviolet LED chips is covered with a layer of glue powder; the layer of glue powder fixes the blue light LED chips and/or the ultraviolet LED chips on the substrate, and is a mixture of a transparent adhesive medium and red fluorescent particles; and
by controlling a weight ratio of the transparent adhesive medium to the red fluorescent particles in the layer of glue powder, as well as a thickness of the layer of glue powder, a ratio range of the photon number of red light to blue light emitted by the LED light source for supplementing the light to the plants per a unit time is (65-95):(5-35); or a ratio range of photon number of the red light, the blue light to ultraviolet light emitted by the LED light source for supplementing the light to the plants per a unit time is (70-95):(5-30):(1-5).

10. A flip-type high-voltage LED light source for supplementing light to plants, comprising a substrate, a high-voltage LED chip set and a layer of glue powder; wherein,
the high-voltage LED chip set comprises a plurality of LED chips connected in series and/or in parallel; the plurality of LED chips are configured as blue light LED chips and/or ultraviolet LED chips; and
an insulating layer is formed on the substrate, a connecting circuit is formed on the insulating layer, and a P electrode bonding pad and a N electrode bonding pad of the high-voltage LED chip set are welded on the connecting circuit by eutectic welding, bonding or conductive adhesion;

an upper part of each of the plurality of LED chips is covered with a layer of glue powder; the layer of glue powder fixes the plurality of LED chips on the substrate and the layer of glue powder fixes is a mixture of a transparent adhesive medium and red fluorescent particles; and by controlling a weight ratio of the transparent adhesive medium and the red fluorescent particles in the layer of glue powder as well as a thickness of the layer of glue powder, a ratio range of photon number of red light to blue light emitted by the flip-type high-voltage LED light source for supplementing the light to the plants per a unit time is (65-95):(5-35); or a ratio range of photon number of the red light, the blue light to ultraviolet light emitted by the flip-type high-voltage LED light source for supplementing the light to the plants per a unit time is (70-95):(5-30):(1-5).

11. The flip-type high-voltage LED light source for supplementing light to plants according to claim 10, wherein the blue light emitted by the blue light LED chips and the ultraviolet light emitted by the ultraviolet LED chips pass through the red fluorescence particles in the layer of glue powder to form a spectrum matching photosynthesis curve after a wavelength conversion, and the spectrum is suitable for light requirements of different growth stages of the plants;

the blue light LED chips emit the blue light with a main wavelength range of 400 nm to 480 nm, and the red fluorescent particles in the layer of glue powder are excited by the blue light to generate red light with a main wavelength range of 600 nm to 680 nm, unexcited blue light and excited and converted light forms the spectrum, wherein the spectrum matches spectrum characteristics of plant photosynthesis; and the ultraviolet LED chips emit the ultraviolet light with a main wavelength range of 320 nm to 400 nm, and the red fluorescent particles in the layer of glue powder are excited by the ultraviolet light to generate the red light with the main wavelength range of 600 nm to 680 nm, and the unexcited ultraviolet light and the excited and converted light form the spectrum, wherein the spectrum conforms to the characteristics of the plant photosynthesis curve.

12. The flip-type high-voltage LED light source according to claim 11, wherein the blue light LED chips are LED chips with a light-emitting peak in the range of 400 nm to 480 nm or a combination of the blue light LED chips with different wavelengths, and the ultraviolet LED chips are LED chips with a light-emitting peak in the wavelength range of 320 nm to 400 nm or a combination of the ultraviolet LED chips with different wavelengths.

13. The flip-type high-voltage LED light to claim 12, wherein each of the plurality of LED chips is a flip-type LED chip, and each of the plurality of LED chips comprises a substrate layer, and a N-GaN layer, a light-emitting layer, a P-GaN layer and a transparent conductive layer stacked sequentially under the substrate layer; and each of the plurality of LED chips is arranged with a P electrode bonding pad and an N electrode bonding pad, and the P electrode bonding pad and the N electrode bonding pad are on the same side of the each of the plurality of LED chips, the P electrode bonding pad is arranged on the transparent conductive layer, the N electrode bonding pad is arranged on the N-GaN layer, and the P electrode bonding pad and the N electrode bonding pad are electrically isolated from each other; and each of the plurality of LED chips is flip-type welded on the substrate and interconnected through a connecting circuit on the substrate.

14. The flip-type high-voltage LED light source according to claim 13, wherein a working voltage of the flip-type LED chip is 9-220V, and the plurality of LED chips are connected in series and/or in parallel, and driven by an external DC or AC voltage, and a driving voltage is equal to or close to a working voltage of an external AC or DC.

15. The flip-type high-voltage LED light source according to claim 13, wherein the plurality of LED chips are connected in series, and the P electrode bonding pad of each of the LED chips is connected to the N electrode bonding pad of another LED chip by a connecting circuit.

16. The flip-type high-voltage LED light source according to claim 13, wherein the plurality of LED chips are connected in series and then in parallel, and comprise at least two parallel-connected LED chip sets, and the P electrodes and the N electrodes of the plurality of LED chips in each of the at least two parallel-connected LED chip sets are connected in series with each other through connecting electrodes.

17. The flip-type high-voltage LED light source according to claim 13, wherein the plurality of LED chips are connected in parallel and then in series, and comprise at least two series-connected LED chip sets, and the P electrodes and the N electrodes of the plurality of LED chips in each of the at least two series-connected LED chip sets are connected in parallel to each other through connecting electrodes.

* * * * *